(12) United States Patent
Katagiri et al.

(10) Patent No.: US 9,053,748 B2
(45) Date of Patent: Jun. 9, 2015

(54) RECONSTRUCTIVE ERROR RECOVERY PROCEDURE (ERP) USING RESERVED BUFFER

(71) Applicant: International Business Machines Corporation, Armonk, NY (US)

(72) Inventors: Takashi Katagiri, Yokohama (JP); Pamela R. Nylander-Hill, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/676,477

(22) Filed: Nov. 14, 2012

(65) Prior Publication Data

US 2014/0136918 A1 May 15, 2014

(51) Int. Cl.
*H03M 13/00* (2006.01)
*G11B 20/18* (2006.01)
*H03M 13/29* (2006.01)

(52) U.S. Cl.
CPC ....... *G11B 20/1833* (2013.01); *H03M 13/2909* (2013.01); *H03M 13/293* (2013.01); *G11B 2020/1853* (2013.01)

(58) Field of Classification Search
CPC ............ H03M 13/2957; H03M 13/29; H03M 13/1515; H03M 13/2909; G11B 20/1833
See application file for complete search history.

(56) References Cited

U.S. PATENT DOCUMENTS

| 5,247,523 | A |  | 9/1993 | Arai et al. |
|---|---|---|---|---|
| 5,684,810 | A |  | 11/1997 | Nakamura et al. |
| 5,844,919 | A | * | 12/1998 | Glover et al. ............... 714/769 |
| 6,624,958 | B1 |  | 9/2003 | Alva |
| 6,640,326 | B1 | * | 10/2003 | Buckingham et al. ........ 714/769 |
| 6,738,942 | B1 |  | 5/2004 | Sridharan et al. |
| 6,779,149 | B1 |  | 8/2004 | Dong |
| 6,920,005 | B2 | * | 7/2005 | Yun ................................ 360/53 |
| 6,958,873 | B2 |  | 10/2005 | Sved |

(Continued)

FOREIGN PATENT DOCUMENTS

| CN | 101101790 A | 1/2008 |
|---|---|---|
| CN | 101611385 A | 12/2009 |

(Continued)

OTHER PUBLICATIONS

U.S. Appl. No. 13/676,493, filed Nov. 14, 2012.

(Continued)

*Primary Examiner* — Albert Decady
*Assistant Examiner* — Enamul M Kabir
(74) *Attorney, Agent, or Firm* — Zilka-Kotab, PC

(57) ABSTRACT

According to one embodiment, a method for reading data from a medium includes reading a data set from a medium repeatedly using different settings until either: a reconstructed data set is sent to a host and/or stored, or a maximum number of rereads has been reached, after each reading of the data set, storing each row to the reserved data buffer that has no errors or errors in the row are correctable using C1-Error Correction Code (ECC) unless a matching row already exists in the reserved data buffer that has fewer corrected errors therein, assembling the data set from the rows stored in the reserved data buffer to form an assembled data set, correcting any remaining errors in the assembled data set using C2-ECC to form the reconstructed data set, and sending the reconstructed data set to the host and/or storing the reconstructed data set.

12 Claims, 7 Drawing Sheets

(56) References Cited

U.S. PATENT DOCUMENTS

| | | | |
|---|---|---|---|
| 7,280,293 B2 | 10/2007 | Nylander-Hill et al. | |
| 7,624,328 B2 | 11/2009 | Unruh | |
| 7,840,872 B2 * | 11/2010 | Andersen | 714/758 |
| 7,987,404 B2 * | 7/2011 | Fukuda et al. | 714/752 |
| 8,209,693 B2 * | 6/2012 | Matsuo | 718/103 |
| 8,793,552 B2 | 7/2014 | Katagiri et al. | |
| 8,810,944 B1 | 8/2014 | Katagiri et al. | |
| 2005/0149819 A1 | 7/2005 | Hwang | |
| 2008/0235556 A1 | 9/2008 | Eleftheriou et al. | |
| 2009/0287956 A1 * | 11/2009 | Flynn et al. | 714/6 |
| 2010/0162083 A1 | 6/2010 | Chung et al. | |
| 2012/0002317 A1 * | 1/2012 | Hirata et al. | 360/48 |
| 2012/0206831 A1 * | 8/2012 | Katagiri et al. | 360/73.04 |
| 2014/0136919 A1 | 5/2014 | Katagiri et al. | |
| 2014/0189460 A1 | 7/2014 | Katagiri et al. | |
| 2015/0026510 A1 | 1/2015 | Katagiri et al. | |

FOREIGN PATENT DOCUMENTS

| | | |
|---|---|---|
| EP | 1758023 A2 | 2/2007 |
| WO | WO2008109586 A1 | 9/2008 |

OTHER PUBLICATIONS

Notice of Allowance and Fee(s) Due from U.S. Appl. No. 13/676,493 dated Jan. 10, 2014.
Notice of Allowance and Fee(s) Due from U.S. Appl. No. 13/943,674 dated Apr. 4, 2014.
Notice of Allowance and Fee(s) Due from U.S. Appl. No. 13/676,493 dated Mar. 14, 2014.
Katagiri et al., U.S. Appl. No. 14/199,911, filed on Mar. 6, 2014.
Katagiri et al., U.S. Appl. No. 13/943,674, filed on Jul. 16, 2013.
Notice of Allowance and Fee(s) Due from U.S. Appl. No. 13/943,674 dated Feb. 19, 2014.
Katagiri et al., U.S. Appl. No. 14/149,752, filed on Jan. 7, 2014.
Katagiri et al., U.S. Appl. No. 14/149,758, filed on Jan. 7, 2014.
Non-Final Office Action from U.S. Appl. No. 14/285,271 dated Jul. 21, 2014.
International Search Report and Written Opinion from PCT Application No. PCT/CN2013/084934 dated Jan. 16, 2014.
U.S. Appl. No. 14/285,271, filed May 22, 2014.
Final Office Action from U.S. Appl. No. 14/285,271, dated Jan. 30, 2015.

* cited by examiner

RECONSTRUCTIVE ERROR RECOVERY PROCEDURE (ERP) USING RESERVED BUFFER

BACKGROUND

The present invention relates to data storage, and more particularly, to reading data from tape using a reconstructive error recovery procedure (ERP) to reduce backhitches during error burst scenarios.

Tape and optical storage devices use very powerful error correction codes, such as product codes or concatenated codes, in conjunction with interleaving to provide a very high degree of data integrity. These error correction schemes typically use two error correction codes (ECCs) as component codes. Two important burst-error performance measures for tape storage systems protected by these schemes are: 1) lateral width of an erroneous stripe which is still capable of being corrected (this is also known as "broken track correction" capability), and 2) longitudinal width of an erroneous stripe that is still capable of being corrected. A "broken" track generally refers to a track that cannot be read correctly due to a problem on the media itself and/or a problem with the readback channel, e.g., as a channel that does not detect data correctly because of alignment or some systematic problem with the head.

When a tape drive reads data from a tape, or when a tape drive writes data to a tape, a unit of data that is read or written is referred to as a "data set." The data set is encoded using interleaved sets of codewords that are organized into an ECC-encoded matrix of size M bytes×N bytes (M×N) and then written to tape as shown in FIG. 1, according to the prior art. There are two levels of encoding within this matrix 150. The first level of encoding utilizes the matrix rows 102. Each row 102 of the matrix contains C1-ECC row parity 106, which adds p-bytes of C1-ECC to the n-bytes of user data (e.g., N=n+p bytes). The second level of encoding, C2-ECC column parity 108, adds q-bytes of C2-ECC to each matrix column 104. For example, if q=12, then adding 12 bytes of C2-ECC would add 12 rows to the matrix 150 (e.g., M=m+q bytes).

When the data set is read from the tape in a high error rate condition, C1/C2 ECC is not capable of correcting the read data. For example, in some approaches, C1-encoding is capable of correcting 10 bytes of error, and C2-encoding is capable of correcting 20 bytes of error. If the error bytes exceed this correction power, then data cannot be read from the tape. In this scenario, the tape drive will then attempt ERP to read the data set from the tape again with a different hardware setting (e.g., changing the tape speed). ERP repeats until C1/C2-encoding is able to correct the data or until the ERP retry count exceeds a threshold. If the retry count exceeds the threshold, then the tape drive will report a permanent error for the read operation.

There are several problems with this conventional approach. First, if the error rate is consistently high, C1 and C2 cannot correct the data and the tape drive fails to read the data set, which is extremely undesirable. Second, in areas of tape where the error rate is high due to media damage, marginal writing, data written in older formats, etc., the drive may fail to read. Third, extended recovery involves multiple backhitches necessary to reread data from the tape which degrades host performance and can also further damage media.

Accordingly, it would be beneficial to have a data recovery procedure that increases the efficiency of reading stored data from the tape.

BRIEF SUMMARY

In one embodiment, a system for reading data from a medium includes logic adapted for reading a data set from a medium one or more times, the data set including a plurality of portions which combine together to wholly form the data set, wherein during each read of the data set, settings are changed in an attempt to better read the data set from the medium, logic adapted for storing all portions of the data set to a reserved data buffer after a first reading of the data set from the medium, logic adapted for storing one or more of the portions of the data set to the reserved data buffer after subsequent readings of the data set from the medium when the one or more portions are correctable using C1-error correction code (ECC), logic adapted for aggregating the one or more portions of the data set in the reserved data buffer to form an assembled data set, wherein each of the one or more portions are correctable using C1-ECC, logic adapted for determining whether C2-ECC is capable of correcting all errors in the assembled data set, logic adapted for correcting any remaining errors in the assembled data set using C2-ECC to form a reconstructed data set and sending the reconstructed data set to a host when C2-ECC is capable of correcting all errors in the assembled data set, and logic adapted for rereading the data set from the medium using a different setting in an error recovery procedure (ERP) when an error in the assembled data set is not correctable using C2-ECC.

In another embodiment, a tape drive includes a data buffer including a reserved data buffer, logic adapted for reading a data set from a medium repeatedly using different settings until either: a reconstructed data set is sent to a host and/or stored, or a maximum number of rereads has been reached, logic adapted for, after each reading of the data set, storing each row to the reserved data buffer that has no errors or errors in the row are correctable using C1-ECC unless a matching row already exists in the reserved data buffer that has fewer corrected errors therein, logic adapted for assembling the data set from the rows stored in the reserved data buffer when all rows are present in the reserved data buffer to form an assembled data set, logic adapted for correcting any remaining errors in the assembled data set using C2-ECC to form the reconstructed data set, and logic adapted for sending the reconstructed data set to the host and/or storing the reconstructed data set.

According to another embodiment, a method for reading data from a medium includes reading a data set from a medium one or more times, the data set including a plurality of portions which combine together to wholly form the data set, wherein during each read of the data set, settings are changed in an attempt to better read the data set from the medium, storing all portions of the data set to a reserved data buffer after a first reading of the data set from the medium, storing one or more of the portions of the data set to the reserved data buffer after subsequent readings of the data set from the medium when the one or more portions are correctable using C1-ECC, aggregating the one or more portions of the data set in the reserved data buffer to form an assembled data set, wherein each of the one or more portions are correctable using C1-ECC, determining whether C2-ECC is capable of correcting all errors in the assembled data set, correcting any remaining errors in the assembled data set using C2-ECC to form a reconstructed data set and sending the reconstructed data set to a host when C2-ECC is capable of correcting all errors in the assembled data set, and rereading the data set from the medium using a different setting in an ERP when an error in the assembled data set is not correctable using C2-ECC.

According to another embodiment, a method for reading data from a medium includes reading a data set from a medium repeatedly using different settings until either: a reconstructed data set is sent to a host and/or stored, or a maximum number of rereads has been reached, after each reading of the data set, storing each row to the reserved data buffer that has no errors or errors in the row are correctable using C1-ECC unless a matching row already exists in the reserved data buffer that has fewer corrected errors therein, assembling the data set from the rows stored in the reserved data buffer to form an assembled data set, correcting any remaining errors in the assembled data set using C2-ECC to form the reconstructed data set, and sending the reconstructed data set to the host and/or storing the reconstructed data set.

Other aspects and embodiments of the present invention will become apparent from the following detailed description, which, when taken in conjunction with the drawings, illustrates by way of example the principles of the invention.

DETAILED DESCRIPTION

Figure 1:
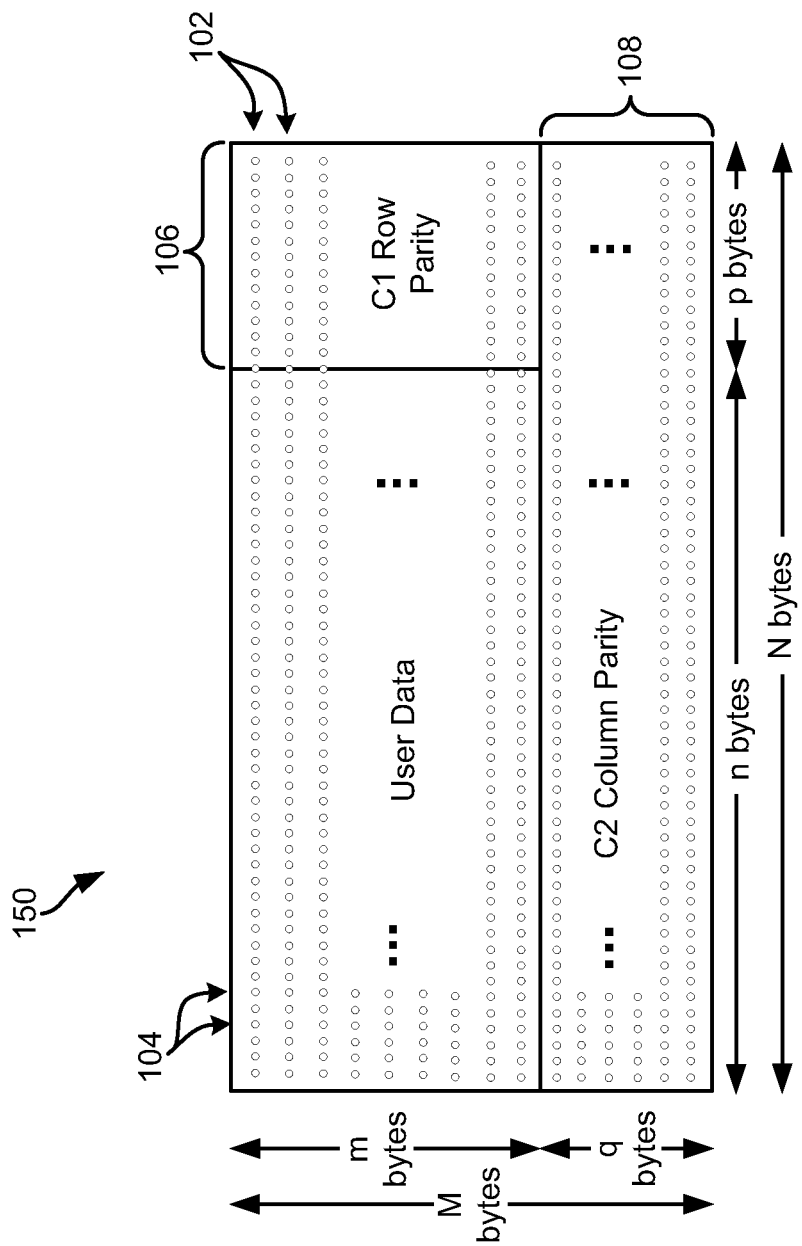
FIG. 1 shows a data set matrix, according to the prior art.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In one general embodiment, a system for reading data from a medium includes logic adapted for reading a data set from a medium one or more times, the data set including a plurality of portions which combine together to wholly form the data set, wherein during each read of the data set, settings are changed in an attempt to better read the data set from the medium, logic adapted for storing all portions of the data set to a reserved data buffer after a first reading of the data set from the medium, logic adapted for storing one or more of the portions of the data set to the reserved data buffer after subsequent readings of the data set from the medium when the one or more portions are correctable using C1-error correction code (ECC), logic adapted for aggregating the one or more portions of the data set in the reserved data buffer to form an assembled data set, wherein each of the one or more portions are correctable using C1-ECC, logic adapted for determining whether C2-ECC is capable of correcting all errors in the assembled data set, logic adapted for correcting any remaining errors in the assembled data set using C2-ECC to form a reconstructed data set and sending the reconstructed data set to a host when C2-ECC is capable of correcting all errors in the assembled data set, and logic adapted for rereading the data set from the medium using a different setting in an error recovery procedure (ERP) when an error in the assembled data set is not correctable using C2-ECC.

In another general embodiment, a tape drive includes a data buffer including a reserved data buffer, logic adapted for reading a data set from a medium repeatedly using different settings until either: a reconstructed data set is sent to a host and/or stored, or a maximum number of rereads has been reached, logic adapted for, after each reading of the data set, storing each row to the reserved data buffer that has no errors or errors in the row are correctable using C1-ECC unless a matching row already exists in the reserved data buffer that has fewer corrected errors therein, logic adapted for assembling the data set from the rows stored in the reserved data buffer when all rows are present in the reserved data buffer to form an assembled data set, logic adapted for correcting any remaining errors in the assembled data set using C2-ECC to form the reconstructed data set, and logic adapted for sending the reconstructed data set to the host and/or storing the reconstructed data set.

According to another general embodiment, a method for reading data from a medium includes reading a data set from a medium one or more times, the data set including a plurality of portions which combine together to wholly form the data set, wherein during each read of the data set, settings are changed in an attempt to better read the data set from the medium, storing all portions of the data set to a reserved data buffer after a first reading of the data set from the medium, storing one or more of the portions of the data set to the reserved data buffer after subsequent readings of the data set from the medium when the one or more portions are correctable using C1-ECC, aggregating the one or more portions of the data set in the reserved data buffer to form an assembled data set, wherein each of the one or more portions are correctable using C1-ECC, determining whether C2-ECC is capable of correcting all errors in the assembled data set, correcting any remaining errors in the assembled data set using C2-ECC to form a reconstructed data set and sending the reconstructed data set to a host when C2-ECC is capable of correcting all errors in the assembled data set, and rereading the data set from the medium using a different setting in an ERP when an error in the assembled data set is not correctable using C2-ECC.

According to another general embodiment, a method for reading data from a medium includes reading a data set from a medium repeatedly using different settings until either: a reconstructed data set is sent to a host and/or stored, or a maximum number of rereads has been reached, after each reading of the data set, storing each row to the reserved data buffer that has no errors or errors in the row are correctable using C1-ECC unless a matching row already exists in the reserved data buffer that has fewer corrected errors therein, assembling the data set from the rows stored in the reserved data buffer to form an assembled data set, correcting any remaining errors in the assembled data set using C2-ECC to form the reconstructed data set, and sending the reconstructed data set to the host and/or storing the reconstructed data set.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2A:
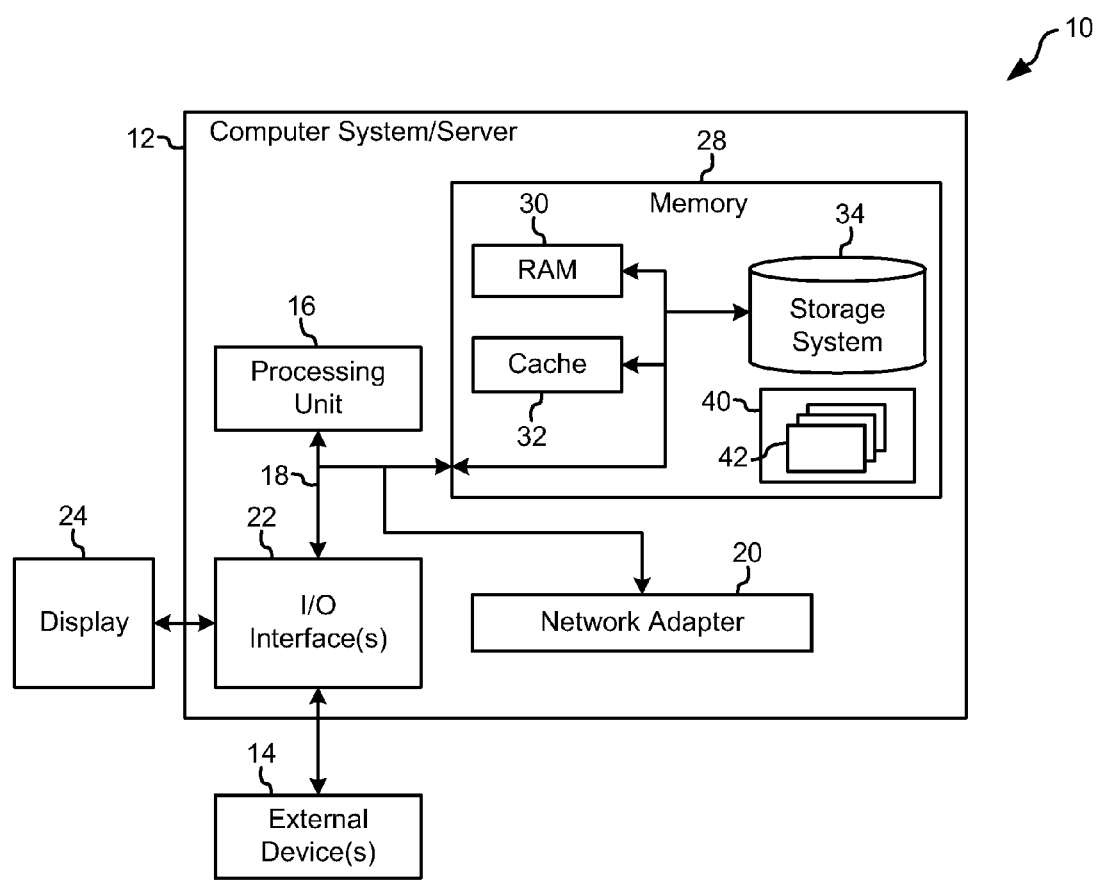
FIG. 2A illustrates a network storage system, according to one embodiment.

Referring now to FIG. 2A, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 2A, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2B:
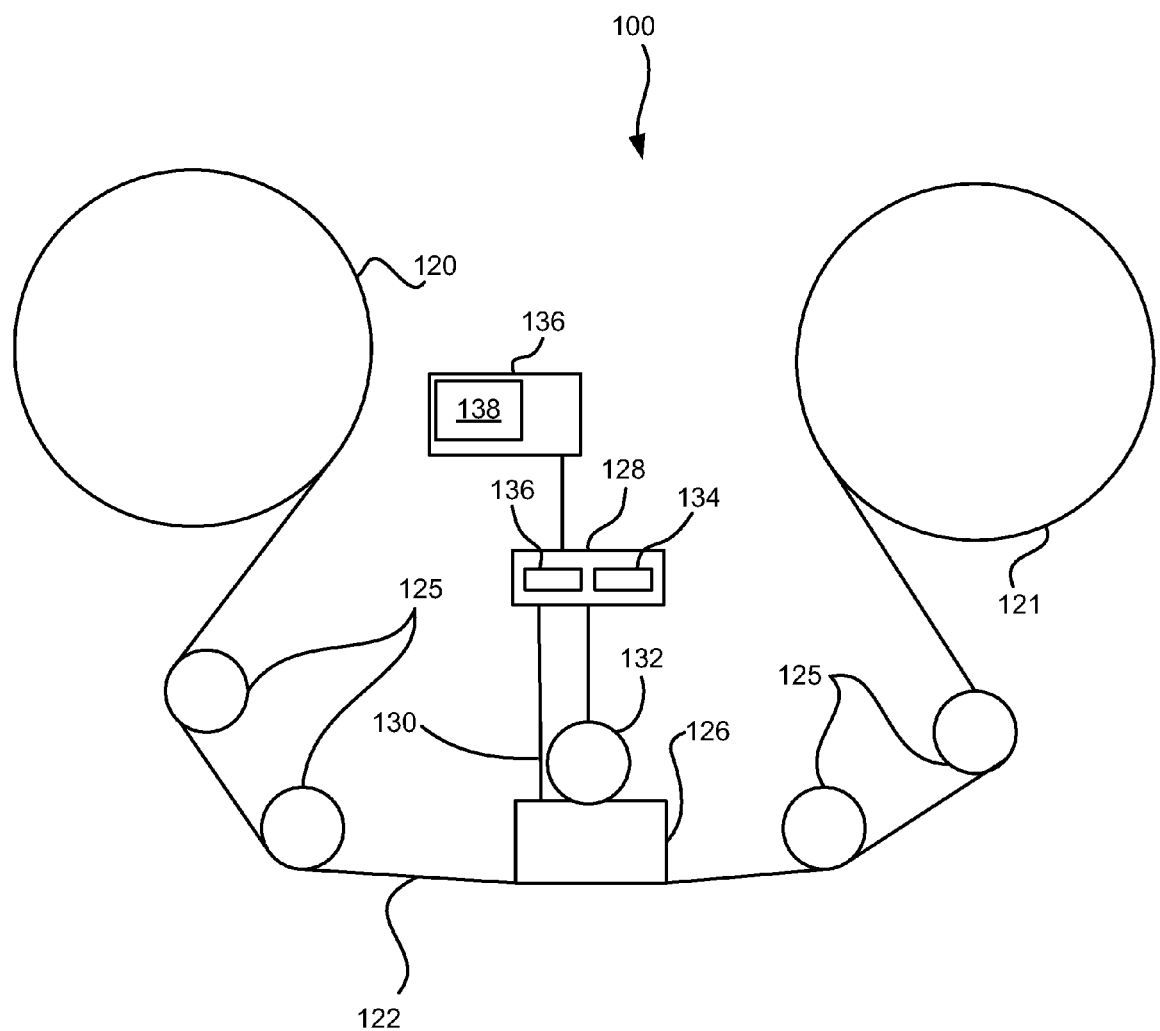
FIG. 2B illustrates a simplified tape drive of a tape-based data storage system, according to one embodiment.

FIG. 2B illustrates a simplified tape drive 100 of a tape-based data storage system, which may be employed according to various embodiments. While one specific implementation of a tape drive is shown in FIG. 2B, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 2B, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 2B) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

In one embodiment, the tape drive 100 may comprise a data buffer 136 which is accessible by the tape drive 100 and the controller 128. This data buffer 136 may be split into one or more sections, with one section being a reserved data buffer 138 to be used for storage of partial data sets during reading operations from the tape 122.

An interface may also be provided for communication between the tape drive 100 and a host (integral or external) to send and receive the data and for controlling the operation of the tape drive 100 and communicating the status of the tape drive 100 to the host, as would be understood by one of skill in the art.

Various types of error correction code (ECC) schemes are used in data storage to achieve very low bit error rates, e.g., magnetic tape and optical storage products are designed to ensure bit error rates in the range of $1 \times 10^{-17}$ to $1 \times 10^{-19}$ under normal operating conditions. Linear block codes, such as Reed-Solomon (RS) codes and low-density parity-check (LDPC) codes, have generally been preferred ECC schemes used in data storage products.

According to one embodiment, a reconstructive data recovery method uses a reserved data buffer portion of a tape drive's data buffer to store data from repeated data set read recovery attempts. The encoded data is reconstructed iteratively as error recovery procedure (ERP) repeats data set re-read from a tape to the reserved data buffer.

After each read of data from the tape, it may be determined which rows, each row including C1-encoded data, are satisfactory (referred to as good C1 rows) and which are not. This determination may be based on whether the C1 row has no errors or if the errors are correctable using C1-ECC. In the first read, all rows are stored to the reserved data buffer regardless of the quality of the read. However, in each subsequent read of the data from the tape, only those C1 rows which are better than a C1 row already stored to the reserved data buffer is written to the reserved data buffer in order to replace the C1 row currently stored thereto. In one embodiment, the C1 rows may be stored to the reserved data buffer after an ERP retry step has completed (e.g., one reread of data from the tape).

According to one scenario, when the error occurs randomly between each of the ERP retry steps, then different C1 rows will be uncorrectable in each ERP reread. Accordingly, by aggregating good C1 rows in the reserved data buffer, a complete data read with good C1 rows will be assembled in the reserved data buffer through repeated ERP retry steps. In contrast, with conventional methods, each reread would be analyzed separately, and regardless of the good C1 rows that are present, when a sufficient number of bad C1 rows are read, the entire data set will be deemed to be uncorrectable and another ERP retry step will be performed. With the present method, each reread can accumulate good C1 rows in the reserved data buffer, and when C2-ECC is subsequently able to correct the data, then the error is recovered, the ERP retry steps will cease, and the entire reconstructed data set will be copied from the reserved data buffer and sent to the host.

By utilizing the methods described herein according to various embodiments to read data from a tape, it is possible to recover errors even though there is no hardware setting that is capable of reading the data from the tape in a recoverable state in a single retry. This is because the methods described herein use multiple retry steps and store recoverable data from each reread in the reserved data buffer in order to assemble an entire data set which is then recoverable. For example, if a first hardware setting is effective to read the data for a first half of the data set, and a second hardware setting is effective to read the data for a second half of the data set, the methods described herein are capable of recovering the error using two retries that apply these two different hardware settings, whereas a conventional method would not be able to read the data in these two retries. This is because, according to current methods, at least a third hardware setting, or even more hardware settings in some instances, would be required to read the data for the entire data set. When there is no single hardware setting capable of reading the entire data set, then with conventional methods, the data set would not be capable of being read.

Therefore, by using the methods described herein according to various embodiments, the elapsed time used for ERP is reduced, since good C1 rows are assessed after each reread with different hardware settings (an ERP retry), are accumulated in the reserved data buffer, and then assembled to reconstruct the entire data set. In this fashion, the number of repeated ERP retries may all contribute to recovering the error and lead to quicker read data recovery. Using current methods, unless the data read from the tape in a single ERP retry has fewer error bytes than the allowed C1/C2 threshold, the data set cannot be recovered. Accordingly, using conventional methods, ERP retries are repeated multiple times until the drive finds a suitable hardware setting to read the error data set completely in a single reread attempt. For example, in the scenario described above, if a first hardware setting is effective to read the data for a first half of the data set, and a second hardware setting is effective to read the data for a second half of the data set, conventional methods are not capable of recovering the error using these two retries that apply these two different hardware settings, and instead must try at least a third hardware setting. If this setting is not capable of recovering the error for the entire data set, and if not, then a fourth or more hardware setting must be tried. By this process, it can be shown that conventional methods would not be able to read such a data set successfully in a single reread despite a series of modified hardware settings. This adds to the amount of time to recover the error for the entire data set over what is possible using the methods described herein.

Data sets are written on tape, and each data set has a number (data set number) which is assigned to it sequentially from the beginning of the tape. For example, when the tape drive attempts to read data set #N (DS#N), DS#N can either be read without errors, be read with errors that are correctable with C1/C2-ECC, or cannot be read due to high error count (e.g., C1/C2-ECC cannot correct the errors). Even if all data cannot be recovered by C1/C2-ECC, some good C1 rows may still be read from the tape, and these good C1 rows may be stored from the tape to the reserved data buffer on the tape drive. Following the first read retry from tape, all C1 rows may be stored to the reserved data buffer, in one approach.

Each C1 row has the information which identifies the data set number from which the C1 row was read (which data set the C1 row belongs to), and the tape drive may use this to check the validity of the C1 row (DS#N or not). If the C1 row is for DS#N, then the syndrome of the C1 row may be checked in another approach, and this syndrome may indicate whether or not the error is recoverable via C1-ECC correcting power. After so verified, the tape drive copies this C1 row to the reserved data buffer area. When the next ERP also attempts to read DS#N from the tape, the validity check of C1 row and the data set number are already completed, which saves time. If there are new good C1 rows, these new good C1 rows are also copied (aggregated) in the reserved data buffer. If a sufficient number of C1 rows are so aggregated, the drive then attempts to correct the data via C2-ECC. If C2-ECC is able to correct all the error in the aggregated C1 rows, this indicates that the tape drive has successfully reconstructed an entire data set and the tape drive may then transfer this data set to the host.

Figure 3:
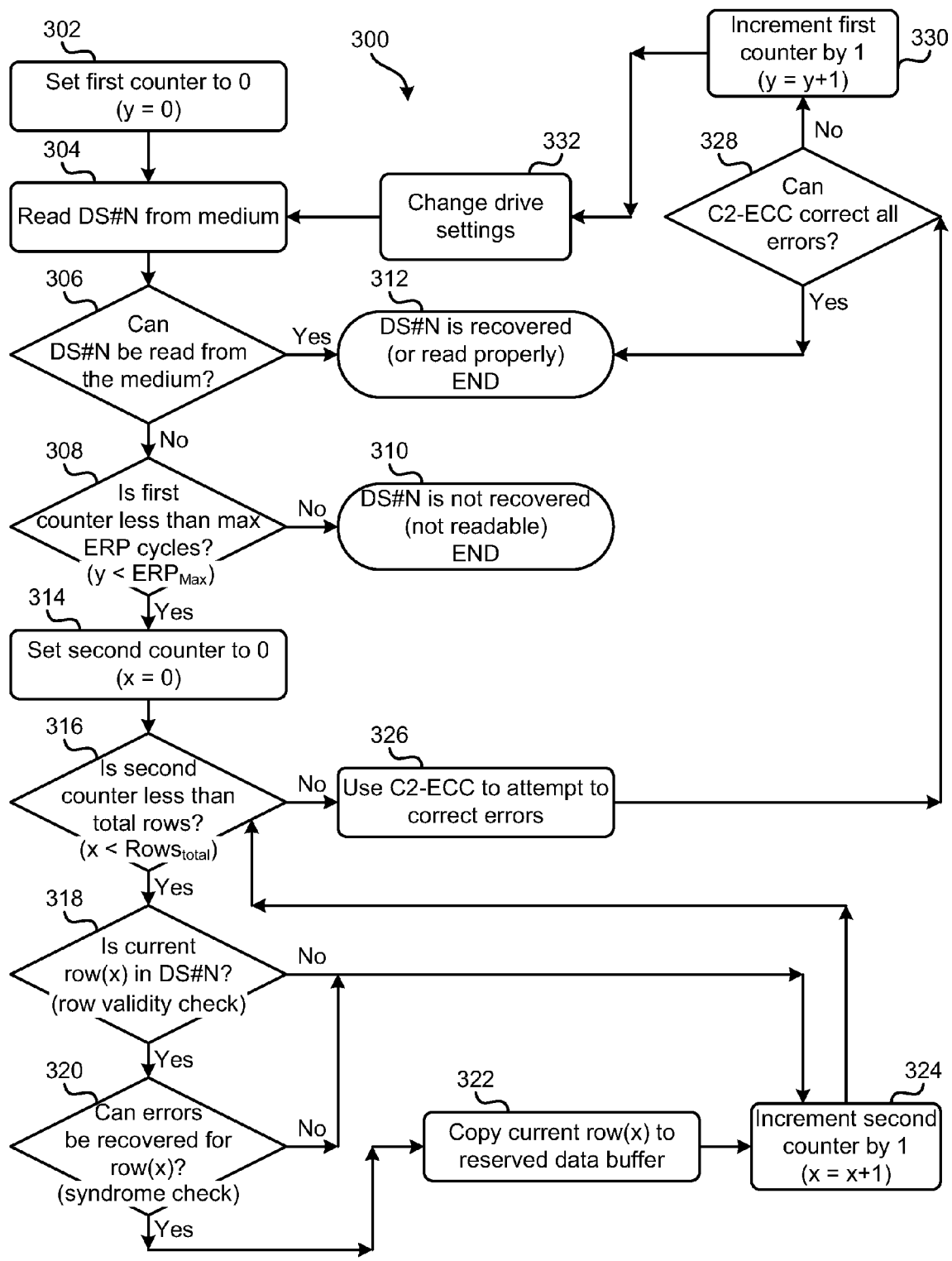
FIG. 3 shows a method for reading data from a medium using a reconstructive error recovery procedure (ERP), according to one embodiment.

Now referring to FIG. 3, a method 300 for data set reconstructive ERP is shown according to one embodiment. The method 300 may be performed in accordance with the present invention in any of the environments depicted in FIGS. 1-2B, among others, in various embodiments. Of course, more or less operations than those specifically described in FIG. 3 may be included in method 300, as would be understood by one of skill in the art upon reading the present descriptions.

In operation 302, a first counter (represented by y) is set to zero (y=0). This first counter may be used to count a number of rereads of the data set from the medium.

In operation 304, a data set (DS#N) is read from the medium. For each subsequent reread, the same data set (DS#N) is read from the medium, but it is read using different settings. DS#N may be at a beginning of the medium, somewhere in the middle, or at an end of the medium. The data set will be reread until a maximum allowable number of data set reads ($ERP_{max}$) is reached or the data set is reconstructed correctly, whichever occurs first.

In operation 306, it is determined if the data set can be read from the medium, which indicates that there are no errors in the data set. If so, then the method 300 continues on to operation 312 and ends. Otherwise, when the data set cannot be read without errors, the method 300 continues to operation 308.

In operation 308, it is determined if the first counter is less than the maximum allowable number of data set reads (ERP cycles), e.g., $y<ERP_{max}$. If the first counter equals the maximum allowable number of data set reads, as shown in operation 310, the data set is not recovered, not readable, and the method ends. In one approach, the host may be informed of the failed data set read.

When the first counter is less than the maximum allowable number of data set reads ($ERP_{max}$), in operation 314, a second counter is set to 0 (x=0) which can be used to count the total number of data set array rows and the method 300 continues on to operation 316.

In operation 312, the method 300 ends with the data set being recovered. In one approach, the data set may be sent to the host.

In operation 316, it is determined if the second counter is less than the total rows in the data set array, e.g., x<$Rows_{total}$. If so, the method 300 continues on to operation 318; otherwise, the method continues on to operation 326.

In optional operation 318, it is determined if the current row, row(x), belongs to the current data set (DS#N) using a validity check. If the row does belong to the current data set, the method 300 continues on to operation 320; otherwise, the method continues on to operation 324.

Figure 6:
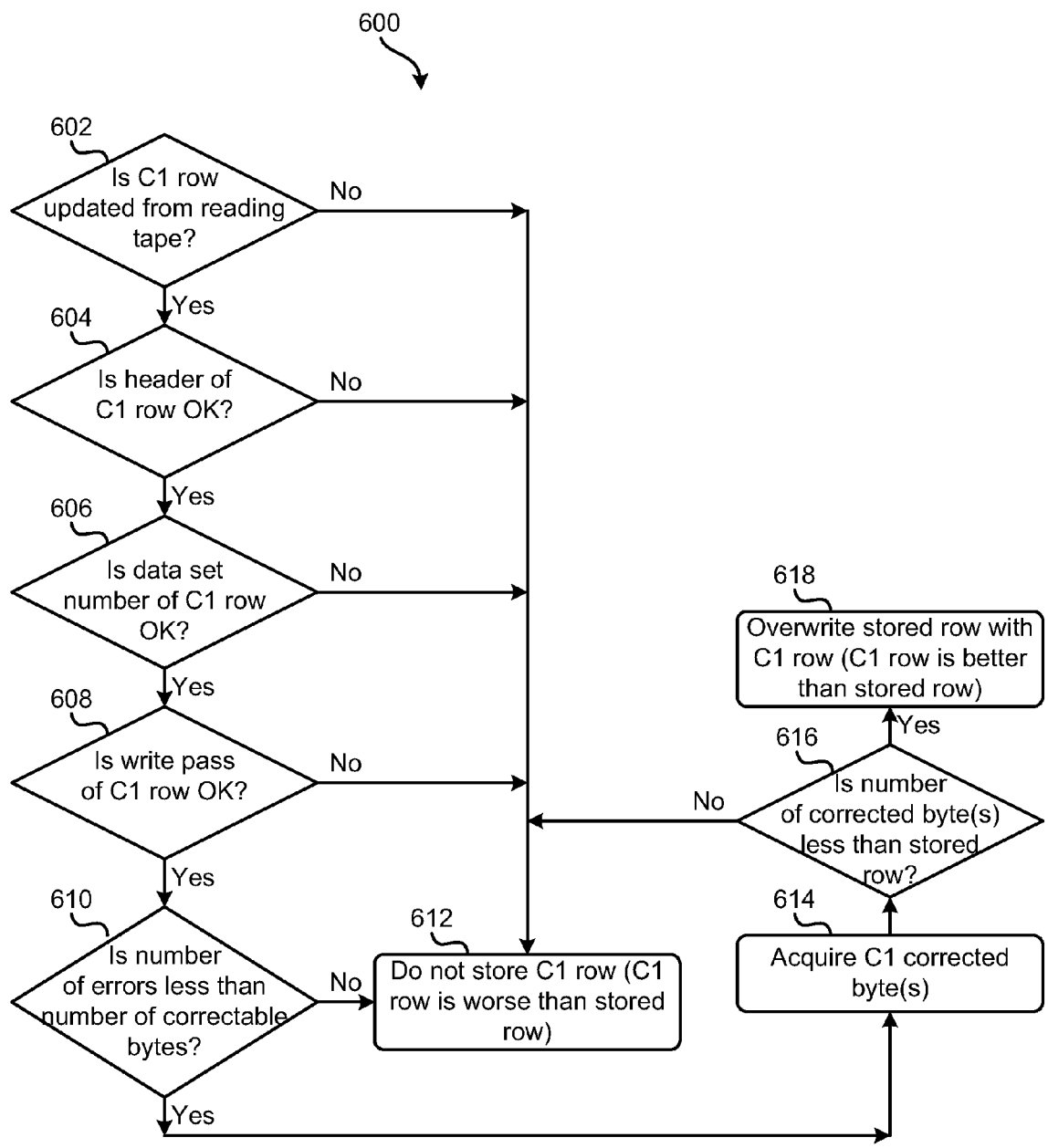
FIG. 6 shows a method, according to one embodiment.

In operation 320, it is determined if errors in the current row can be recovered using C1-ECC of the row in a process referred to as a syndrome check, which is described in more detail in reference to FIG. 6. With continued reference to FIG. 3, if errors in the current row can be recovered, the method 300 continues on to operation 322; otherwise, the method continues on to operation 324.

In operation 322, the current row is copied and stored to the reserved data buffer to be assembled into the entire data set after all rows have been stored thereto and have only recoverable error therein.

In operation 324, the second counter is incremented by one, e.g., x=x+1. This causes the next instance of operations 316-320 to be performed on the next row of the data set.

In operation 326, C2-ECC is used to attempt to correct all errors in the data set, since all rows in the data set have now been stored to the reserved data buffer.

In operation 328, it is determined if all errors in the data set can be recovered using C2-ECC. If so, the method 300 continues on to operation 312 and ends; otherwise, the method continues on to operation 330 to reread the data set using different settings.

In operation 330, the first counter is incremented by one, e.g., y=y+1.

In operation 332, the drive settings are changed in order to try to read the data set with fewer errors (or at least some rows of the data set which previously have not been read with correctable error).

According to method 300, less rereads of the data set may be required in order to produce a data set with correctable error because it is not necessary to correctly read the entire data set in a single reread. Instead, select rows of the data set having fewer errors will be aggregated across multiple retries into a reserved data buffer.

Figure 4:
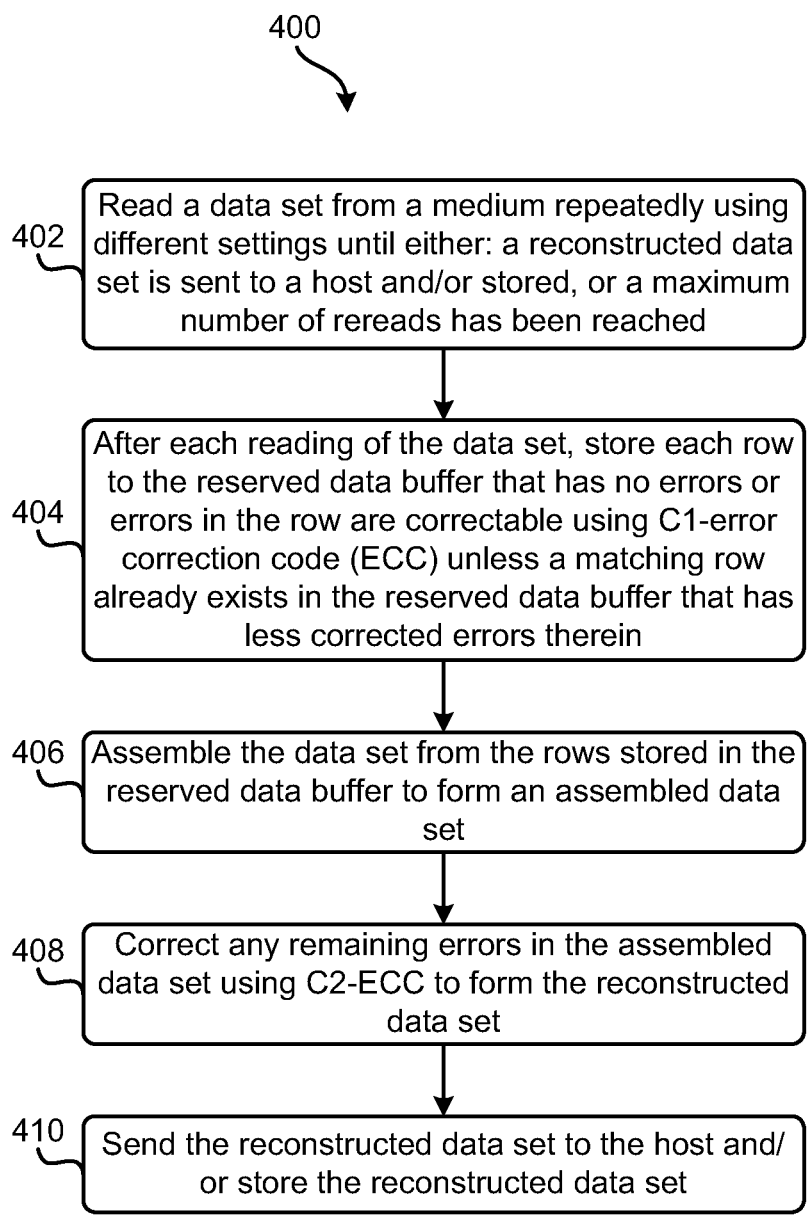
FIG. 4 shows a method for reading data from a medium using a reconstructive ERP, according to one embodiment.

Now referring to FIG. 4, a method 400 for reading data from a medium using reconstructive ERP is shown according to one embodiment. The method 400 may be performed in accordance with the present invention in any of the environments depicted in FIGS. 1-3, among others, in various embodiments. Of course, more or less operations than those specifically described in FIG. 4 may be included in method 400, as would be understood by one of skill in the art upon reading the present descriptions.

Each of the steps of the method 400 may be performed by any suitable component of the operating environment. For example, in various non-limiting embodiments, the method 400 may be partially or entirely performed by a C1/C2 decoding system, a tape drive, a hard disk drive, an optical drive, a controller, a processor (such as a CPU, an ASIC, a FPGA, etc.) which may be embedded in and/or operate within a system, etc.

As shown in FIG. 4, method 400 may initiate with operation 402, where a data set is read from a medium repeatedly using different settings until either: a reconstructed data set is sent to a host and/or stored, or a maximum number of rereads has been reached (the ERP is ended).

Different settings may comprise a change to any suitable setting, such as any of the following: a medium speed during reading, a data flow correction power, channel parameters, servo tracking, etc.

The maximum number of rereads may be a hardware setting of a drive, a predetermined number based on past attempts, a user setting, or a number derived through any other method known in the art. In another embodiment, the number may be a dynamic parameter associated with or based on some aspect of the rereads, such as a marginal improvement in data read, a length of time expended on rereads, a data set's importance, etc.

In one embodiment, the medium may be a magnetic tape, and the method 400 may be performed by a tape drive.

In operation 404, after each reading of the data set, each row that has no errors or errors in the row are correctable using C1-ECC is stored to the reserved data buffer unless a matching row already exists in the reserved data buffer that has fewer corrected errors therein. A matching row is a row which is positioned in the same location in the data set array. For example, if row 1 of the data set (which has three corrected errors therein) is already stored in the reserved data buffer, and row 1 is read again using different settings and has only two corrected errors therein, then the stored row 1 is overwritten by the reread row 1.

In one approach, each row may be stored to the reserved data buffer after the first read so that the entire data set is stored to the reserved data buffer, then in subsequent reads, the rows of the data set may be improved (e.g., fewer corrected errors in each row).

According to one embodiment, each row may comprise a C1-encoded row in an array representing the data set.

In operation 406, the data set is assembled from the rows stored in the reserved data buffer when all stored rows of the data set have correctable error therein in the reserved data buffer to form an assembled data set.

In operation 408, any remaining errors in the assembled data set are corrected using C2-ECC across columns of the data set to form the reconstructed data set.

In operation 410, the reconstructed data set is sent to a host and/or stored to a memory, such as in a tape drive, server, etc.

Figure 5:
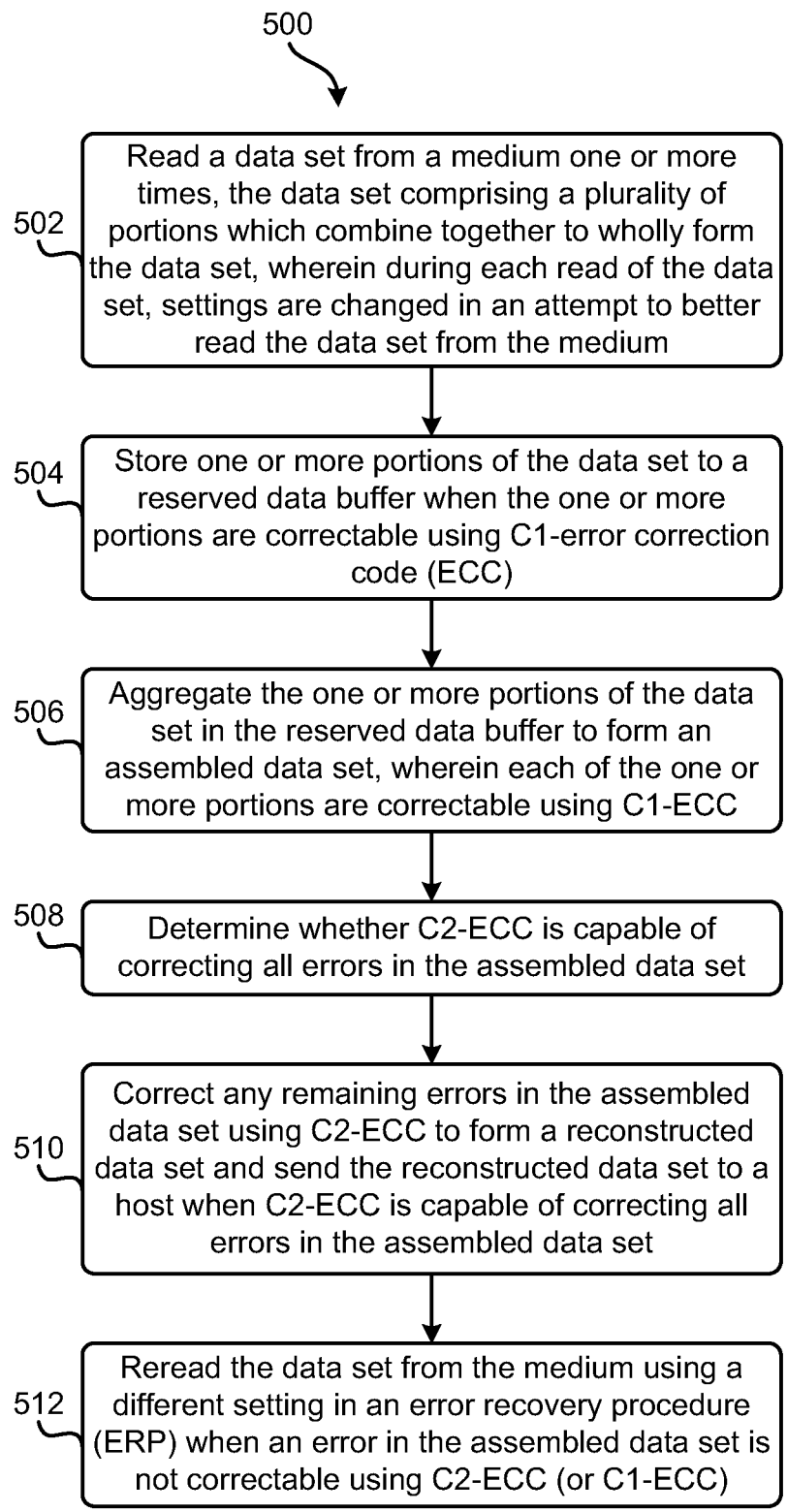
FIG. 5 shows a method for reading data from a medium using a reconstructive ERP, according to one embodiment.

Now referring to FIG. 5, a method 500 for reading data from a medium using reconstructive ERP is shown according to one embodiment. The method 500 may be performed in accordance with the present invention in any of the environments depicted in FIGS. 1-3, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various non-limiting embodiments, the method 500 may be partially or entirely performed by a C1/C2 decoding system, a tape drive, a hard disk drive, an optical drive, a controller, a processor (such as a CPU, an ASIC, a FPGA, etc.) which may be embedded in and/or operate within a system, etc.

As shown in FIG. 5, method 500 may initiate with operation 502, where a data set is read from a medium one or more times. The data set comprises a plurality of portions which combine together to wholly form the data set. In this way, each portion of the data set is combined together to form the whole data set, if any portion has not been saved to the reserved data buffer, then the whole data set cannot be formed. Each portion may be any part of the data set, and the data set may be represented by any structure. Furthermore, during each read of the data set, settings are changed in an attempt to better read the data set from the medium. By better read, what is meant is that fewer errors are encountered in the read data set by adjusting the settings used to read the data set from the medium.

Different settings may comprise a change to any suitable setting, such as any of the following: a medium speed during reading, a data flow correction power, channel parameters, servo tracking, etc.

In one embodiment, each portion is a row in an array representing the data set, as described in more detail herein. Specifically, the plurality of portions may be C1-encoded rows in the array representing the data set. Furthermore, each row of the array may comprise a header along with data encoded and interleaved into C1 codewords therein. In another embodiment, each portion may be a column in the array, in which the C1 steps are switched with C2 steps.

In an optional operation, all portions of the data set may be stored to a reserved data buffer after a first reading of the data set from the medium. In this way, the data set may be stored to the reserved data buffer in its entirety, and portions may be overwritten when they are better than a portion already stored to the reserved data buffer.

The reserved data buffer may be part of a larger data buffer of a medium drive, such as a tape drive when the medium is a tape, or it may be a separate, dedicated memory for storage thereto, either in the drive or accessible to the drive used to read the data set.

In operation 504, one or more portions of the data set are stored to the reserved data buffer when the one or more portions are correctable using C1-ECC. When all portions of the data set are stored to the reserved data buffer after the first reading of the data set, operation 504 may be performed after subsequent readings of the data set from the medium. This means that any errors present in the portion may be corrected using the C1-encoding of the portion, without relying on any C2-encoding of the data set. Should the portion not be correctable using C1-encoding, the portion is not stored to the reserved data buffer.

In one embodiment, when a portion already exists in the reserved data buffer that matches a read portion that has correctable error therein, the existing portion is overwritten when the corresponding portion from the one or more portions (the read portion that has correctable error therein) has fewer corrected errors therein than the existing portion. For example, if a stored portion has three corrected errors, and a read portion only has two corrected errors, the read portion will overwrite the stored portion in the reserved data buffer.

In operation 506, the one or more portions of the data set are aggregated in the reserved data buffer to form an assembled data set, wherein each of the one or more portions are correctable using C1-ECC. In this way, after all portions of the data set have been stored to the reserved data buffer and are correctable using C1-ECC, the entire data set may be assembled from "good" portions which have a correctable number of errors therein.

In operation 508, it is determined whether C2-ECC is capable of correcting all errors in the assembled data set, if any such errors remain. In this way, if some errors remain in the data set after assembling the portions together to form the entire data set, they may be corrected using C2-encoding across the portions. For example, if the portions are rows, then the C2-encoding is across the columns and may be used to correct any remaining errors.

In operation 510, any remaining errors in the assembled data set are corrected using C2-ECC to form a reconstructed data set and the reconstructed data set is sent to a host when C2-ECC is capable of correcting all errors in the assembled data set.

In operation 512, the data set is reread from the medium using a different setting in an ERP when an error in the data set is not correctable using C2-ECC (or C1-ECC). In this way, using different settings, such as different hardware settings, portions which were not recoverable in a previous read may now be recoverable, and the entire data set may be assembled in the reserved data buffer.

According to one embodiment, the method 500 may be repeated until either a reconstructed data set is sent to the host, or a number of allowable retries is reached and the data set is reported to the host as unreadable. The number of allowable retires may be a hardware setting of a drive, a predetermined number based on past attempts, a user setting, or a number derived through any other method known in the art.

In other words, the data set is reread from the medium, existing portions in the reserved data buffer are overwritten with portions having fewer errors corrected therein, and it is determined whether C2-ECC is capable of correcting all errors in the assembled data set until either a reconstructed data set is sent to the host, or a number of allowable retries is reached and the data set is reported to the host as unreadable.

In one approach, the medium may be a magnetic tape, and the method 500 may be performed by a tape drive.

In a further embodiment, the method 500 may be executed by a system for reading data from a medium using logic. For example, the system may comprise logic adapted for reading a data set from a medium one or more times, the data set comprising a plurality of portions which combine together to wholly form the data set, wherein during each read of the data set, settings are changed in an attempt to better read the data set from the medium; logic adapted for, optionally, storing all portions of the data set to a reserved data buffer after a first reading of the data set from the medium; logic adapted for storing one or more of the portions of the data set to the reserved data buffer after subsequent readings of the data set from the medium when the one or more portions are correctable using C1-ECC; logic adapted for aggregating the one or more portions of the data set in the reserved data buffer to form an assembled data set, wherein each of the one or more portions are correctable using C1-ECC; logic adapted for determining whether C2-ECC is capable of correcting all errors in the assembled data set; logic adapted for correcting any remaining errors in the assembled data set using C2-ECC to form a reconstructed data set and sending the reconstructed data set to a host when C2-ECC is capable of correcting all errors in the assembled data set; and logic adapted for rereading the data set from the medium using a different setting in an ERP when an error in the assembled data set is not correctable using C2-ECC.

Now referring to FIG. 6, the syndrome check is explained in more detail. When data is read from the medium, in the form of a data set, the data set is transferred to the drive buffer. Each row of the data set includes at least the following information: header information, write pass number, data set number, indicator for uncorrected or corrected status, and corrected bytes of C1-encoding. Using the above information, in one embodiment, the drive is capable of verifying that a currently read row is better than a previously stored row in the reserved data buffer. This process may be as shown in FIG. 6, or performed in any other way known in the art.

In FIG. 6, the method 600 begins with operation 602, where it is determined if the C1 row (the current row read from the data set for the remainder of the description of method 600) has been updated after reading the data set from tape. That is to say, during some data set reads, a particular row may not be readable, and if it is not, then method 600 ends at operation 612 because there is no row to compare.

In operation 604, it is determined if the header of the C1 row is acceptable. Each row has header information, and this header information helps to determine if the correct row is stored to the buffer. If not, the method ends at operation 612.

In operation 606, it is determined if the data set number is acceptable for the C1 row. The data set number is assigned from the beginning of the medium, such as 0 to N. The drive has knowledge of which data set is being manipulated in the buffer, and it is determined if the data set number of the C1 row is the same as that in the buffer. If not, the method ends at operation 612.

In operation 608, it is determined if the write pass of the C1 row is acceptable. Write pass is information which indicates the generation of the data set on the medium. If the data set number is the same, the data set which has a higher write pass is newer, making it the valid data set. Since the drive has knowledge of the write pass of the target data set, if the write pass number of the C1 row is less than the stored data set, the C1 row is discarded as being older and the method ends at operation 612.

In operation 610, it is determined if the number of errors in the C1 row is less than a maximum number of correctable errors, which is determined by the C1-encoding of the row in the data set. This is often referred to as a syndrome check. If not, the method ends at operation 612.

In operation 612, the C1 row is not stored to the buffer and the method 600 ends because the C1 row is worse than the row currently stored to the buffer.

In operation 614, the C1 corrected byte or bytes are acquired based on the C1-encoding to correct errors in the C1 row.

In operation 616, it is determined if the number of corrected byte(s) for the C1 row is less than the number of corrected byte(s) for the stored row. If so, the method 600 continues to method 618 where the C1 row is stored to the buffer (and possibly overwrites a current row in the buffer corresponding to the C1 row). If not, the method ends at operation 612.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system for reading data, the system comprising:
   logic configured to set a first counter to zero prior to reading a data set;
   logic configured to read the data set one or more times, the data set comprising a plurality of portions which combine together to wholly form the data set, wherein during each read of the data set, settings are changed in an attempt to better read the data set and the first counter is incremented by one;
   logic configured to store all portions of the data set to a reserved data buffer after a first reading of the data set;
   logic configured to determine whether the stored data set is correctable using at least one of C1-error correction code (ECC) and C2-ECC, wherein when the data set is correctable using at least one of C1-ECC and C2-ECC, the stored data set is recovered;
   logic configured to determine whether the first counter equals a predetermined threshold prior to each read of the data set, wherein when the first counter equals the predetermined threshold the data set is reported as unreadable;
   logic configured to set a second counter to zero prior to rereading the data set;
   logic configured to reread portions assumed to be in the data set;
   logic configured to perform a validity check to determine whether a currently read portion is in the data set;
   logic configured to determine that the currently read portion of the data set is correctable using C1-ECC using a syndrome check when the validity check confirms that the portion is from the data set;
   logic configured to store one or more of the portions of the data set to the reserved data buffer after subsequent readings of the data set when the one or more portions are correctable using C1-ECC;
   logic configured to determine that all portions of the data set have been reread according to the second counter, wherein the second counter is incremented by one after any of: storing a portion of the data set, determining that the currently read portion is not in the data set, and determining that the currently read portion of the data set is not correctable using C1-ECC;
   logic configured to aggregate the one or more portions of the data set in the reserved data buffer to form an assembled data set, wherein each of the one or more portions are correctable using C1-ECC;
   logic configured to determine whether C2-ECC is capable of correcting all errors in the assembled data set;
   logic configured to correct any remaining errors in the assembled data set using C2-ECC to form a reconstructed data set and send the reconstructed data set to a host when C2-ECC is capable of correcting all errors in the assembled data set: and
   logic configured to reread the data set using a different setting in an error recovery procedure (ERP) when an error in the assembled data set, is not correctable using C2-ECC.

2. The system as recited in claim 1, wherein the plurality of portions of the data set are C1-encoded rows in an array representing the data set.

3. The system as recited in claim 1, wherein when a portion already exists in the reserved data buffer, the existing portion is overwritten when a corresponding portion from the one or more portions that are correctable using C1-ECC has fewer corrected errors therein than the existing portion.

4. The system as recited in claim 1, wherein when the data set is reread, existing portions in the reserved data, buffer are overwritten with portions having fewer errors corrected therein, and it is determined whether C2-ECC is capable of correcting all errors in the assembled data set until either the reconstructed data set is sent to the host, or a number of allowable retries is reached as indicated by the counter and the data set is reported to the host as unreadable.

5. The system as recited claim 1, wherein the data set is read from a magnetic tape.

6. The system as recited in claim 5, wherein different settings comprise a change to at least one of: a tape speed during reading and a data flow correction power.

7. A method for reading data, the method comprising:
setting a first counter to zero prior to reading a data set;
reading the data set one or more times, the data set comprising a plurality of portions which combine together to wholly form the data set, wherein during each read of the data set, settings are changed in an attempt to better read the data set and the first counter is incremented by one;
storing all portions of the data set to a reserved data buffer after a first reading of the data set;
determining whether the stored data set is correctable using at least one of C1-error correction code (ECC) and C2-ECC, wherein when the data set is correctable using at least one of C1-ECC and C2-ECC, the stored data set is recovered;
determining whether the first counter equals a predetermined threshold prior to each read of the data set, wherein when the first counter equals the predetermined threshold the data set is reported as unreadable;
setting a second counter to zero prior to rereading the data set;
rereading portions assumed to be in the data set;
performing a validity check to determine whether a currently read portion is in the data set;
determining that the currently read portion of the data set is correctable using C1-ECC using a syndrome check when the validity check confirms that the portion is from the data set;
storing one or more of the portions of the data set to the reserved data buffer after subsequent readings of the data set when the one or more portions are correctable using C1-ECC;
determining that all portions of the data set have been reread according to the second counter, wherein the second counter is incremented by one after any of: storing a portion of the data set, determining that the currently read portion is not in the data set, and determining that the currently read portion of the data set is not correctable using C1-ECC;
aggregating the one or more portions of the data set in the reserved data buffer to form an assembled data set, wherein each of the one or more portions are correctable using C1-ECC;
determining whether C2-ECC is capable of correcting all errors in the assembled data set;
correcting any remaining errors in the assembled data set using C2-ECC to form a reconstructed data set and sending the reconstructed data set to a host when C2-ECC is capable of correcting all errors in the assembled data set; and
rereading the data set using a different setting in an error recovery procedure (ERP) when an error in the assembled data set is not correctable using C2-ECC.

8. The method as recited in claim 7, wherein the plurality of portions of the data set are C1-encoded rows in an array representing the data set.

9. The method as recited in claim 7, wherein when a portion already exists in the reserved data buffer, the existing portion is overwritten when a corresponding portion from the one or more portions that are correctable using C1-ECC has fewer corrected errors therein than the existing portion.

10. The method as recited in claim 7, wherein the data set is reread, existing portions in the reserved data buffer are overwritten with portions having fewer errors corrected therein, and it is determined whether C2-ECC is capable of correcting all errors in the assembled data set until either the reconstructed data set is sent to the host, or a number of allowable retries is reached. and the data set is reported to the host as unreadable.

11. The method as recited in claim 7, wherein the data set is read from a magnetic tape.

12. The method as recited in claim 7, wherein different settings comprise a change to at least one of: a tape speed during reading, a data flow correction power, channel parameters, and servo tracking.

* * * * *